United States Patent
Seo et al.

(10) Patent No.: US 9,804,233 B2
(45) Date of Patent: Oct. 31, 2017

(54) MEMS MAGNETIC FIELD SENSOR

(71) Applicant: LG INNOTEK CO., LTD., Seoul (KR)

(72) Inventors: Sang Won Seo, Seoul (KR); Yong Jun Ko, Seoul (KR); Seung Hwa Kwon, Seoul (KR); Jeong Gi Seo, Seoul (KR); Chil Young Ji, Seoul (KR); Wan Seop Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 177 days.

(21) Appl. No.: 14/888,656

(22) PCT Filed: Apr. 24, 2014

(86) PCT No.: PCT/KR2014/003585
§ 371 (c)(1),
(2) Date: Nov. 2, 2015

(87) PCT Pub. No.: WO2014/178572
PCT Pub. Date: Nov. 6, 2014

(65) Prior Publication Data
US 2016/0161572 A1 Jun. 9, 2016

(30) Foreign Application Priority Data

May 3, 2013 (KR) ........................ 10-2013-0050332

(51) Int. Cl.
*G01R 33/02* (2006.01)
*G01R 33/028* (2006.01)
(52) U.S. Cl.
CPC ................ *G01R 33/0286* (2013.01)

(58) Field of Classification Search
CPC combination set(s) only.
See application file for complete search history.

(56) References Cited

U.S. PATENT DOCUMENTS 5,610,335 A   3/1997   Shaw et al.
6,215,318 B1  4/2001   Schoefthaler et al.
(Continued)

FOREIGN PATENT DOCUMENTS

KR   10-2004-0050399 A   6/2004
KR   10-2006-0126739 A   12/2006

OTHER PUBLICATIONS

International Search Report dated Aug. 18, 2014 issued in Application No. PCT/KR2014/003585 (with English Translation).

*Primary Examiner* — Giovanni Astacio-Oquendo
*Assistant Examiner* — Alvaro Fortich
(74) *Attorney, Agent, or Firm* — Ked & Associates, LLP

(57) ABSTRACT

The disclosure provides a magnetic field sensor for sensing the magnetic field caused by a current to be measured, which includes: substrate; a first drive electrode with a path for flowing a reference current supplied from the substrate arranged so as to be moveable by the magnetic field of the current to be measured; and a second drive electrode with a path for flowing a reference current supplied from the substrate arranged so as to be moveable by the magnetic field of the current to be measured, thus measuring the variation of a capacitance caused by the movement of the first drive electrode and the second drive electrode. Hence, the sensing is achieved by the two drive electrodes with no reference electrode, thus maximizing the mechanical displacement to improve the sensing capability.

15 Claims, 12 Drawing Sheets

(56) References Cited

U.S. PATENT DOCUMENTS

| | | | |
|---|---|---|---|
| 2006/0192565 A1* | 8/2006 | Yasuda | G01R 29/24 324/458 |
| 2007/0075806 A1* | 4/2007 | Naito | H03H 9/02393 333/186 |
| 2007/0096729 A1* | 5/2007 | Brunson | G01R 33/022 324/244 |
| 2013/0002244 A1 | 1/2013 | Quevy | |

\* cited by examiner

MEMS MAGNETIC FIELD SENSOR

CROSS-REFERENCE TO RELATED PATENT APPLICATIONS

This application is a U.S. National Stage Application under 35 U.S.C. §371 of PCT Application No. PCT/KR2014/003585, filed Apr. 24, 2014, which claims priority to Korean Patent Application No. 10-2013-0050332, filed May 3, 2013, whose entire disclosures are hereby incorporated by reference.

TECHNICAL FIELD

The embodiment relates to an MEMS magnetic field sensor.

BACKGROUND ART

In general, a micro electro mechanical systems (MEMS) magnetic field sensor based on a capacitive sensing technology includes a drive electrode, which is movable n reaction to a magnetic field, and a fixed electrode which senses the variation of capacitance corresponding to the drive electrode.

A capacitive MEMS magnetic field sensor is disclosed in U.S. Pat. No. 6,664,786.

Regarding the principle of the magnetic field sensor, if a reference current is applied to a drive electrode in a predetermined direction, the drive electrode moves in a positive or negative direction from a fixed electrode by Lorenz force produced depending on the direction and the intensity of a magnetic field introduced into the magnetic field sensor from an outside.

In this case, the distance between the two electrodes or the overlapped area therebetween is varied to vary the capacitance. The variation of the capacitance or a signal varied corresponding thereto are detected so that the magnetic field can be sensed.

However, since Lorenz force used to sense the magnetic field is significantly weaker than gravity, satisfactory mechanical displacement may not be obtained due to the limitation in the design of a sensor structure such as a spring.

In addition, when an AC current or a DC current is applied to the drive electrode for the driving of the drive electrode to detect a varied signal, a desirable signal may be not detected due to the mixture of currents.

DISCLOSURE

Technical Problem

The embodiment provides an MEMS magnetic field sensor having an improved sensing capability and a method of driving the same.

Technical Solution

According to the embodiment, there is provided a magnetic field sensor for sensing a magnetic field caused by a current to be measured. The magnetic field sensor includes a substrate, a first drive electrode having a path, which flows a reference current supplied from the substrate, to be movable by the magnetic field of the current to be measured, and a second drive electrode having a path, which flows the reference current supplied from the substrate, to be movable by the magnetic field of the current to be measured. Variation of a capacitance is measured by movement of the first drive electrode and the second drive electrode.

Advantageous Effects

As described above, according to the magnetic field sensor of the embodiment, since the magnetic field is detected using two drive electrodes without the fixed electrode, the mechanical displacement can be maximized so that the sensing capability can be improved.

In addition, when the AC input power is applied to the magnetic field sensor, the displacement can be maximized by matching the AC frequency with the mechanical resonance frequency of the sensor. In addition, the stoppers can be provided to prevent the mechanical displacement from exceeding a critical value, so that device damage can be prevented.

In addition, the metallic layer having the electrical conductivity is formed at a portion of the magnetic field sensor to increase the mobility of charges so that the reaction reliability and the reaction speed can be increased.

BEST MODE

Mode for Invention

Hereinafter, embodiments will be described in detail with reference to accompanying drawings so that those skilled in the art can easily replicate with the embodiments. However, the embodiments may not be limited to those described below, but have various modifications. In In the following description, when a predetermined part "includes" a predetermined component, the predetermined part does not exclude other components, but may further include other components unless otherwise indicated.

The disclosure provides a micro electro mechanical systems (MEMS) having enlarged displacement Hereinafter, a shaking correction device according to the embodiment of the disclosure will be described with reference to FIGS. 1 to 4.

Figure 1:
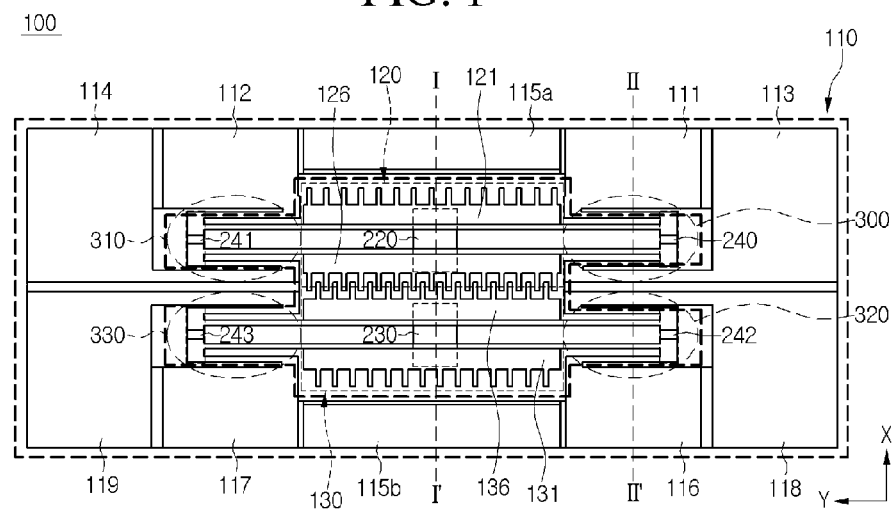
FIG. 1 is a top view showing a magnetic field sensor according to the first embodiment.
Figure 2:
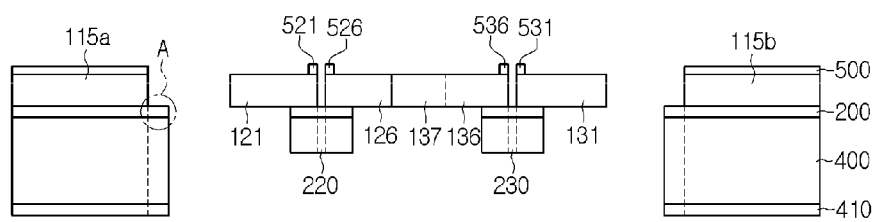
FIG. 2 is a sectional view of the magnetic field sensor taken along line I-I' of FIG. 1.
Figure 3:
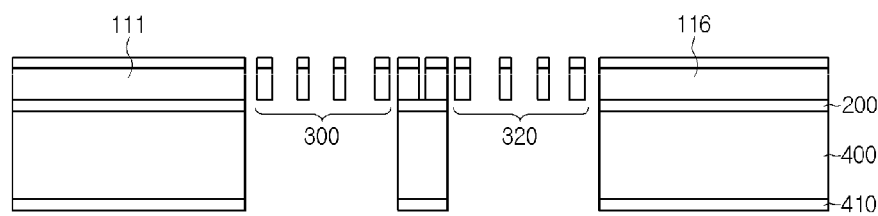
FIG. 3 is a sectional view showing the magnetic field sensor taken along line II-II'.
Figure 4:
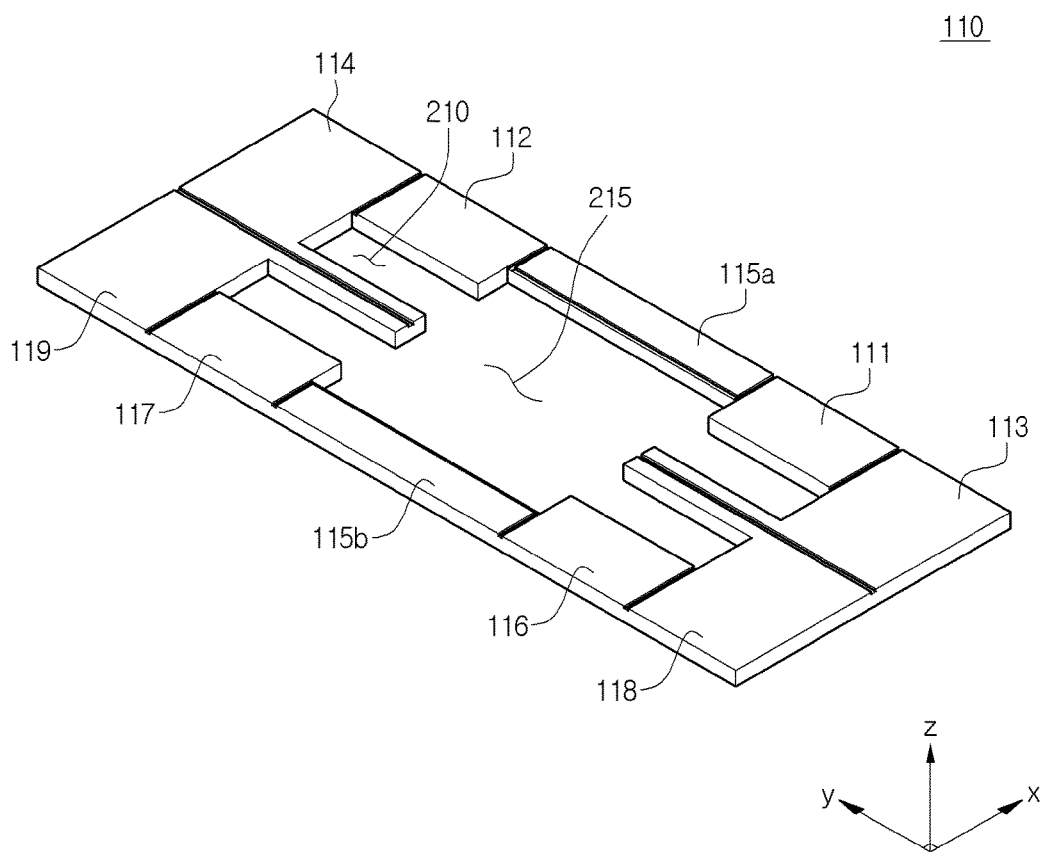
FIGS. 4 to 6 are enlarged views showing elements of FIG. 1.
Figure 5:
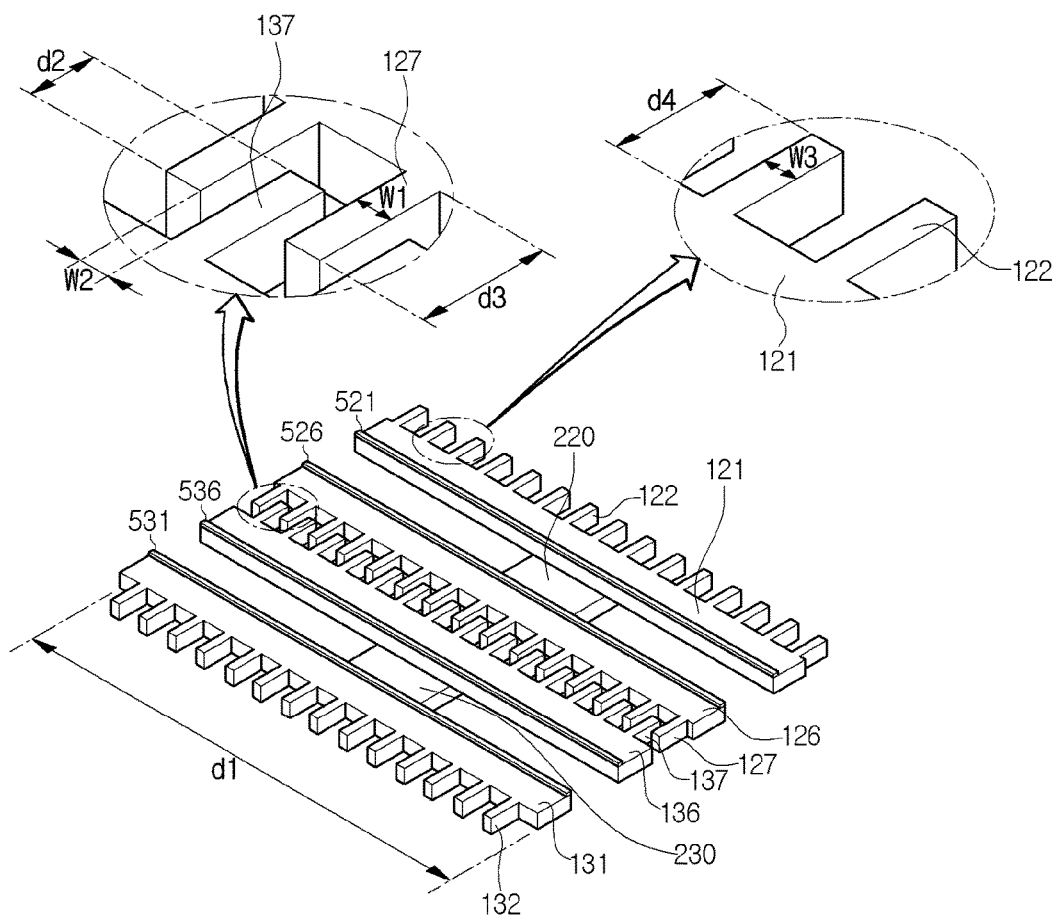
Figure 6:
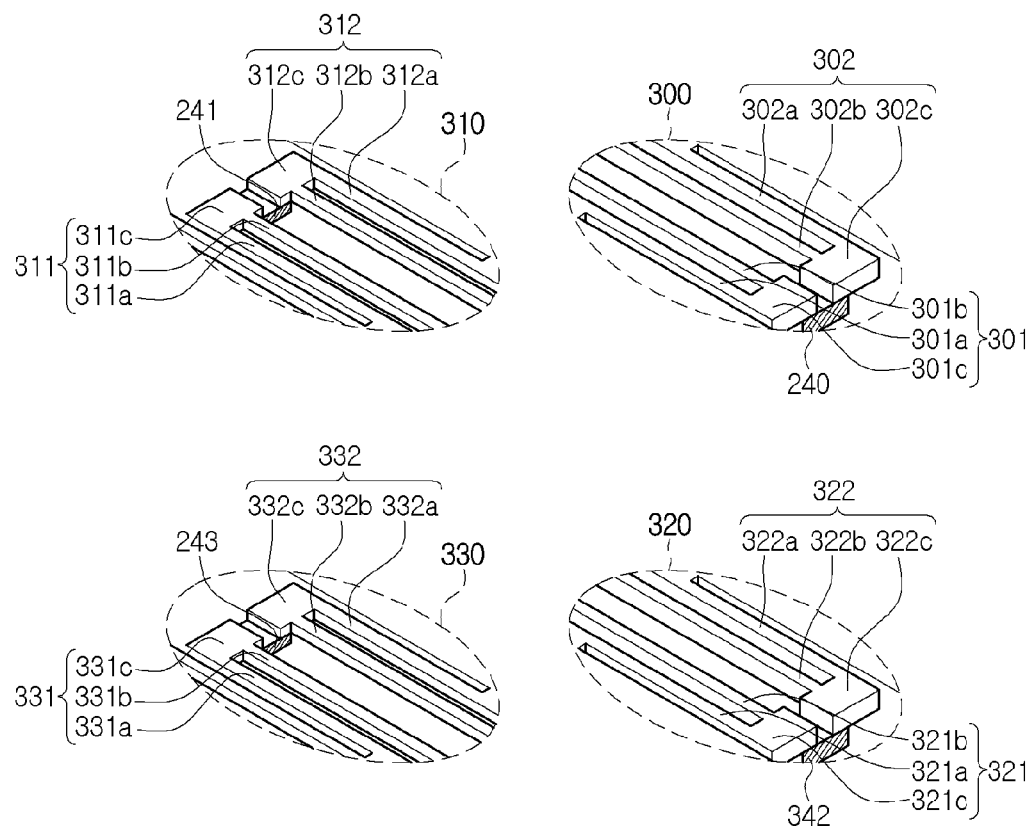

FIG. 1 is a top view showing a magnetic field sensor according to the first embodiment, and FIG. 2 is a sectional view of the magnetic field sensor taken along line I-I' of FIG. 1. FIG. 3 is a sectional view showing the magnetic field sensor taken along line II-II', and FIGS. 4 to 6 are enlarged views showing elements of FIG. 1.

Referring to FIG. 1, the magnetic field sensor according to the embodiment includes a fixed substrate 110, a drive electrode part 120, and a plurality of elastic parts 300, 310, 320, and 330, which are elements of the MEMS.

MEMS refers to a technology of producing micro mechanical structures, such as a high-density integrated circuit, a micro gear, and a hard disk, by machining silicon, crystal or glass. Micro machine is produced with the precision of micrometers or less ($1/1,000,000$ meters) through the MEMS technology. Semiconductor micro-processing technology of repeatedly performing deposition and etching processes is employed for the structure of the MEMS. Electrostatic force and surface tension, which are attractive force between charges, act as driving force of the MEMS to produce current, so that power consumption can be significantly reduced.

In the MEMS magnetic field sensor including the MEMS elements, the fixed substrate 110 supports the drive electrode part 120 and the elastic parts 300, 310, 320, and 330.

The fixed substrate 110 has a plate shape, and may have a rectangular frame shape. The fixed substrate 110 may have a rectangular shape longitudinally extending, and may have an area of 3 mm to 1 mm.

The fixed substrate 110 may have a multi-layer structure, and may include the support substrate 400, an insulating layer 200 on the support substrate 400, and electrode layers 115a and 115b on the insulating layer 200.

Although the support substrate 400 may include a silicon substrate, a glass substrate, or a polymer substrate, the embodiment will be described with a silicon substrate.

The support substrate 400 may have a thickness of 100 μm to 500 μm, and preferably may have the thickness of 400 μm.

The insulating layer 200 is formed on the support substrate 400.

The insulating layer 200 may be formed of a silicon oxide layer or a silicon nitride layer and may have the thickness of 1 μm to 1.5 μm when the support substrate 400 is a silicon substrate.

The electrode layers are formed on the insulating layer 200.

In the fixed substrate 110, the electrode layers are formed on the support substrate 400 having a cavity 215 formed at the center thereof to receive the drive electrode part 120 through patterning and arranged along each side of the rectangle. The electrode layer includes electrodes 111 to 119 separated from each other.

The electrodes 111 to 119 may include a conductive material, such as silicon (Si), copper (Cu), aluminum (Al), molybdenum (Mo), or tungsten (W). Preferably, when the support substrate 400 is the silicon substrate, the electrodes 111 to 119 may be formed of Si. The electrodes 111 to 119 may have the thickness of 10 μm to 100 μm, and preferably have the thickness of about 50 μm.

The electrodes 111 to 119 include four sensing electrodes 113, 114, 118, and 119 arranged at four corners and power electrodes 111, 112, 116, and 117 adjacent to the sensing electrodes 113, 114, 118, and 119 and protruding toward the cavity 215.

In more detail, the first sensing electrode 113 and the second sensing electrode 114 are aligned in line with each other in a y axial direction and arranged at corners, respectively. The first power electrode 111 is formed adjacent to the first sensing electrode 113 to have a width narrower than that of the first sensing electrode 113 in an x axial direction. The second power electrode 112 is aligned in line with each other the first power electrode 111 and formed adjacent to the second sensing electrode 114 to have a width narrower than that of the second sensing electrode 114 in the x axial direction.

According to the embodiment, although the first and second sensing electrodes 113 and 114 are arranged at the corners, when the first and second power electrodes 111 and 112 may extend to the corners, and formed adjacent to the first and second sensing electrodes 113 and 114, respectively, the widths of the first and second sensing electrodes 113 and 114 may not be wider than those of the first and second power electrodes 111 and 112.

The first power electrode 111 and the second power electrode 112 have a distance therebetween. If the distance is out of a predetermined range, a dummy electrode 115a may be additionally interposed between the first and second power electrodes 111 and 112 as shown in FIG. 4.

If the dummy electrode 115a is formed, the dummy electrode 115a is formed with a width narrower than those of the first and second power electrodes 111 and 112 in the x axial direction.

Meanwhile, there are provided the third sensing electrode 118 aligned in line with the first sensing electrode 113 in the x axial direction and the fourth sensing electrode 119 aligned in line with the third sensing electrode 118 in and provided at the corner.

In addition, the third power electrode 116 is formed adjacent to the third sensing electrode 118 to have a width narrower than that of the third sensing electrode 118, and the fourth power electrode 117 is formed in line with the third power electrode 116, and formed adjacent to the fourth sensing electrode 119 to have a width narrower than that of the fourth sensing electrode 119.

The third power electrode 116 and the fourth power electrode 117 have a distance therebetween. If the distance is out of a predetermined range, a dummy electrode 115b may be additionally formed between the first and second power electrodes 111 and 112 as shown in FIG. 4.

If the dummy electrode 115b is formed, the dummy electrode 115b is formed with a width narrower than those of the third and fourth power electrodes 116 and 117.

When the dummy electrodes 115a and 115b are separately formed, the support substrate 400 under the dummy electrodes 115a and 115b may protrude toward the cavity 215. The support substrate 400 may be equal to or narrower than those of the dummy electrodes 115a and 115b in width.

In other words, the widths of the dummy electrodes 115a and 115b are adjusted to expose the lateral sides of the support substrate 400 forming the cavity 215, thereby preventing the short between the dummy electrodes 115a and 115b and reference electrodes 121 and 131.

Sub-cavities are formed due to the differences in width between the sensing electrodes 113, 114, 118, and 119, and the power electrodes 111, 112, 116, and 117 adjacent to the sensing electrodes 113, 114, 118, and 119, respectively, and elastic parts 300, 310, 320, and 330 are provided in the sub-cavities.

Protrusions are further formed by protruding toward the cavity 215 from the sensing electrodes sensing electrodes 113, 114, 118, and 119 to form the sub-cavities together with the power electrodes sensing electrodes 111, 112, 116, and 117 so that the elastic parts 300, 310, 320, and 330 may be supported.

The protrusions may be formed by coupling an adjacent protrusion to structures under the insulating layer 200. The four sub-cavities may have the shape of opening toward the cavity 215.

In this case, a metallic layer may be further formed on the sensing electrodes 113, 114, 118, and 119 and the power electrodes 111, 112, 116, and 117.

The metallic layer 500 is formed of high-conductivity material such as copper (Cu), aluminum (Al), molybdenum (Mo), tungsten (W), or silver (Ag). When the electrode layer is formed of Si, the metallic layer 500 may be formed of a material having electric conductivity higher than that of Si.

As described above, a higher electric conductivity material is applied to the electrode area, so that current can be smoothly spread, thereby increasing a response speed.

The drive electrode parts 120 and 130 are provided in the cavity of the fixed substrate 110.

The drive electrode parts 120 and 130 include the first drive electrode 120 surrounded by the first and second sensing electrodes 113 and 114 and the first and second power electrodes 111 and 112 to receive voltage, and the second drive electrode 130 surrounded by the third and fourth sensing electrode 118 and 119 and the third and fourth power electrodes 116 and 117 to receive voltage.

The first drive electrode 120 includes a first reference electrode 121 and a first variable electrode 126 extending in the y axial direction and at least one coupling part 220 to couple the first reference electrode 121 to the first variable electrode 126 in the cavity 215.

The first reference electrode 121 and the first variable electrode 126 include electrode layers extending from two elastic parts 300 and 310.

The first reference electrode 121 includes a bar-type body to couple the first and second elastic parts 300 and 310 to each other, and is formed to have a width wider than those of leg parts 302*a*, 302*b*, 312*a*, and 312*b* of the first and second elastic parts 300 and 310.

The body protrudes in the x axial direction and enlarged. The enlargement means an enlargement into a space formed by the step difference between the first and second power electrodes 111 and 112 and the dummy electrode 115*a*.

The length d1 of the first reference electrode 121 may be in the range of 500 µm to 5000 µm. Preferably, the length d1 of the first reference electrode 121 may be in the range of 1500 µm to 2500 µm.

The first reference electrode 121 includes a plurality of first reference electrode pieces 122 protruding toward the drive electrode 115*a*.

The first reference electrode pieces 122 may be formed in a comb shape. The width W3 of the first reference electrode piece 212 having a predetermined length d4 may satisfy the range of 1 µm to 30 µm, and preferably the range of 3 µm to 4 µm.

The number of the first reference electrode pieces 122 is determined depending on the length d1 of the first reference electrode 121, the width W3 of the first reference electrode piece 122, and the interval between the first reference electrode pieces 122.

Meanwhile, first variable electrodes 126 has the same shape as that of the first reference electrode 121, and are provided symmetrically to each other about a first variable electrode piece 122. Accordingly, the first drive electrode 120 can maintain the center of gravity in an X axial direction.

In other words, the first variable electrode 126 has a bar-type body to couple the first and second elastic parts 300 and 310 to each other and has a width wider than those of leg parts 301*a*, 301*b*, 311*a*, and 311*b* of the first and second elastic parts 300 and 310.

The width is enlarged in the x axial direction, and the enlargement refers to the enlargement of the step difference by the protrusions of the first and second sensing electrodes 113 and 114 in the cavity 215.

The length d1 of the first variable electrode 126 may be in the range of 500 µm to 5000 µm, and preferably in the range of 1500 µm to 2500 µm.

The first variable electrode 126 includes a plurality of first variable electrode pieces 127 protruding toward the second variable electrode 136.

The first variable electrode pieces 127 may be formed in a comb shape. The width W1 of the first variable electrode piece 127 may satisfy the range of 1 µm to 30 µm, and preferably the range of 3 µm to 4 µm.

The number of the first variable electrode pieces 127 is determined depending on the length d1 of the first reference electrode 121, the W1 of the first variable electrode piece 127, and the interval W2 between the first variable electrode pieces 127.

Meanwhile, the first coupling part 220 has an area exposed between the bodies of the first reference electrode 121 and the first variable electrode 126, and is put on an entire portion or a portion of the bodies of the first reference electrode 121 and the first variable electrode 126.

At least one first coupling part 220 may be provided as shown in FIG. 1. Otherwise, a plurality of first coupling parts may be arranged at a predetermined interval.

The first coupling part 220 is used to electrically insulate the first reference electrode 121 and the first variable electrode 126 from each other while mechanically coupling the first reference electrode 121 to the first variable electrode 126. Accordingly, the first coupling part 220 includes only both of the support substrate 400 and the insulating layer 200 under the electrode layer.

In this case, a portion of the support substrate 400 at the first coupling part 220 is etched to have a thickness thinner than that of the support substrate 400 under the fixed substrate 110. Accordingly, the first coupling part 220 is floated from the lower most point of the fixed substrate 110.

The first coupling part 220 may have an area of 100 µm×300 µm. A longer side of the first coupling part crosses the bodies of the first reference electrode 121 and the first variable electrode 126.

Meanwhile, the second drive electrode 120 includes a second reference electrode 131 and a second variable electrode 136 extending in the y axial direction and at least one second coupling part 230 to couple the second reference electrode 131 and the second variable electrode 136 to each other in the cavity 215.

The second reference electrode 131 and the second variable electrode 136 include an electrode layer extending from the elastic parts 300 and 310.

The second reference electrode 131 may have the same shape as that of the first reference electrode, and symmetrical to the first reference electrode 121.

The second reference electrode 131 has a bar-type body to couple third and fourth elastic part 320 and 330, and includes a plurality of second reference electrode pieces 132 protruding toward the dummy electrode from a longer side of the body.

The second variable electrode 136 has the same shape as that of the second reference electrode and is arranged symmetrically to each other about the second coupling part 230. Accordingly, the second drive electrode 130 may maintain the center of gravity in the x axial direction.

In other words, the second variable electrode 136 has the bar-type body to couple the third and fourth elastic parts 320 and 330, and includes a plurality of second variable electrode pieces 137 protruding toward the first variable electrode 126.

The first and second variable electrode pieces 127 and 137 are arranged to be offset with respect to each other.

In this case, the electrode pieces of the first variable electrode 126 and the second variable electrode 136 are arranged to face each other at the center of the magnetic field sensor to form a variable capacitor.

The capacitance of the variable capacitor is variably determined depending on the offset area of the variable electrode pieces 127 and as the first variable electrode piece 127 is offset with respect to the second variable electrode piece 137 of the second variable electrode 136. Although the variable capacitor has been realized by a comb drive serving as a driver having the comb shape, the spirit of the disclosure is not limited thereto. In other words, the spirit of the disclosure may be realized through various structures capable of realizing a variable capacitor, for example using the difference in distance between facing pieces.

The first variable electrode piece 127 and the second variable electrode piece 137 have an overlap distance d2 of about 30 μm in the state that voltage is not applied to the first to fourth power electrodes 111, 112, 116, and 117 or Lorenz force is not produced.

The distance W2 between one first variable electrode piece 127 and the second variable electrode piece 137 adjacent to the first variable electrode 127 may be in the range of 1 μm to 10 μm, and preferably be in the range of 2 μm to 3 μm.

Meanwhile, the second coupling part 230 is formed identically to the first coupling part 220, and has an area exposed between bodies of the second reference electrode 131 and the second variable electrode 136. The second coupling part 230 is put on a portion or an entire portion of the second reference electrode 131 and the second variable electrode 136.

The second coupling part 230 is used to electrically insulate the second reference electrode 131 and the second variable electrode 136 from each other while mechanically coupling the second reference electrode 131 and the second variable electrode 136 to each other. Accordingly, the second coupling part 230 includes only both of the support substrate 400 and the insulating layer 200 under the electrode layer.

In this case, a portion of the support substrate 400 at the second coupling part 230 is etched to have a thickness thinner than that of the support substrate 400 under the fixed substrate 110. Accordingly, the second coupling part 230 is floated from the lower most point of the fixed substrate 110.

In addition, metallic patterns 521, 526, 531, and 536 extending from a metallic layer 500 of the fixed substrate 110 may be formed on a portion of the bodies of the first reference electrode 121, the first variable electrode 126, the second reference electrode 131, and the second variable electrode 136. Accordingly, current spreading efficiency of each variable electrode and each reference electrode may be improved, so that the reaction speed is increased, the reliability of the output value may be improved.

Meanwhile, the magnetic field sensor include the first elastic parts 300 and 310 to couple the fixed substrate 110 to the first drive electrode 120 and the third elastic parts 320 and 330 to couple the fixed substrate 110 to the second drive electrode 130.

Hereinafter, the details of the first to fourth elastic parts 300, 310, 320, and 330 will be described.

The first to fourth elastic parts 300, 310, 320, and 330 include double folded type springs.

The first to fourth elastic parts 300, 310, 320, and 330 are provided in sub-cavities defined by the power electrodes 111, 112, 116, and 117, and the sensing electrodes 113, 114, 118, and 119, respectively.

In other words, the first elastic part 300 is provided in the sub-cavity defined by the first power electrode 111 and the first sensing electrode 113, and the second elastic part 310 is provided in the sub-cavity defined by the second power electrode 112 and the second sensing electrode 114. In addition, the third elastic part 320 is provided in the sub-cavity defined by the third power electrode 116 and the third sensing electrode 118, and the fourth elastic part 330 is provided in the sub-cavity defined by the fourth power electrode 117 and the fourth sensing electrode 119.

The first elastic part 300 includes a first fixing part 301 and a second fixing part 302.

The first fixing part 301 includes a first spring 301a bent from the protrusion of the first sensing electrode 113 to the sub-cavity and extending, and a second spring 301b coupled to the body of the first variable electrode 126 and provided adjacent to the first spring 301a.

The first fixing part 301 further includes a first coupling end 301c to couple an end of the first spring 301a to an end of the second spring 301b, and the first coupling end 301c is formed in parallel to a bottom of the sub-cavity.

The second fixing part 302 is formed adjacent to the first fixing part 301 and provided in the sub-cavity.

The second fixing part 302 includes a third spring 302a bent from the protrusion of the first power electrode 111 to the sub-cavity and extending, and a fourth spring 302b coupled to the body of the first reference electrode 121 and provided adjacent to the third spring 302a.

The second fixing part 302 further includes a second coupling end 302c to couple an end of the third spring 302a to an end of the fourth spring 302b, and the second coupling end 302c is formed in parallel to a bottom of the sub-cavity.

The first and second coupling ends 301c and 302c are spaced apart from each other adjacent to each other, and include an coupling island 240 formed at a space under the first and second coupling ends 301c and 302c and including the insulating layer 200 and the support substrate 400, which remain, so that the first and second coupling ends 301c and 302c are electrically insulated from each other and mechanically fixed.

In this case, the thickness of the support substrate 400 at the coupling island 240 may be equal to those of the first and second coupling parts 220 and 230, and may have a thickness thinner than that of the support substrate 400 of the fixed substrate 110. Preferably, the thickness of the support substrate 400 may be about 100 um.

The fixed substrate 110 and the first drive electrode 120 are electrically and mechanically connected with each other by the first elastic part 300.

The second elastic part 310 includes a first fixing part 311 and a second fixing part 312.

The first fixing part 311 includes a first spring 311a bent from the protrusion of the second sensing electrode 114 to the sub-cavity and extending, and a second spring 311b coupled to the body of the second variable electrode 136 and provided adjacent to the first spring 311a.

The first fixing part 311 further includes a first coupling end 311c to couple an end of the first spring 311a to an end of the second spring 311b, and the first coupling end 311c is formed in parallel to a bottom of the sub-cavity.

The second fixing part 312 is formed adjacent to the first fixing part 311 and provided in the sub-cavity.

The second fixing part 312 includes a third spring 312a bent from the protrusion of the second power electrode 112 to the sub-cavity and extending, and a fourth spring 312b extending from the first reference electrode 121 and provided adjacent to the third spring 312a.

The second fixing part 312 further includes a second coupling end 312c to couple an end of the third spring 312a to an end of the fourth spring 312b, and the second coupling end 312c is formed in parallel to a bottom of the sub-cavity.

The first and second coupling ends 311c and 312c are spaced apart from each other adjacent to each other, and include an coupling island 241 formed at a separation space under the first and second coupling ends 301c and 302c and including the insulating layer 200 and the support substrate 400, which remain, so that the first and second coupling ends 311c and 312c are electrically insulated from each other and mechanically fixed.

In this case, the thickness of the support substrate 400 at the coupling island 241 may be equal to those of the first and second coupling parts 220 and 230, and may have a thickness thinner than that of the support substrate 400 at the fixed substrate 110. Preferably, the thickness of the support substrate 400 at the coupling island 241 may be about 100 um.

The fixed substrate 110 and the first drive electrode 120 are electrically and mechanically connected with each other by the second elastic part 310.

The third elastic part 320 includes a first fixing part 321 and a second fixing part 322.

The first fixing part 321 includes a first spring 321a bent from the protrusion of the third sensing electrode 118 to the sub-cavity and extending, and a second spring 321b coupled to the body of the second variable electrode 136 and provided adjacent to the second spring 321a.

The first fixing part 321 further includes a first coupling end 321c to couple an end of the first spring 321a to an end of the second spring 321b, and the first coupling end 321c is formed in parallel to a bottom of the sub-cavity.

The second fixing part 322 is formed adjacent to the first fixing part 321 and provided in the sub-cavity.

The second fixing part 322 includes a third spring 322a bent from the protrusion of the third power electrode 116 to the sub-cavity and extending, and a fourth spring 322b extending from the first reference electrode 131 and provided adjacent to the third spring 322a.

The second fixing part 322 further includes a second coupling end 322c to couple an end of the third spring 322a to an end of the fourth spring 322b, and the second coupling end 322c is formed in parallel to a bottom of the sub-cavity.

The first and second coupling ends 321c and 322c are spaced apart from each other adjacent to each other, and include an coupling island 242 formed at a separation space under the first and second coupling ends 321c and 322c and including the insulating layer 200 and the support substrate 400 so that the first and second coupling ends 321c and 322c are electrically insulated from each other and mechanically fixed.

The fixed substrate 110 and the second drive electrode 130 are electrically and mechanically connected with each other by the third elastic part 320.

The fourth elastic part 330 includes a first fixing part 331 and a second fixing part 332.

The first fixing part 331 includes a first spring 331a bent from the protrusion of the fourth sensing electrode 119 to the sub-cavity and extending, and a second spring 331b coupled to the body of the second variable electrode 136 and provided adjacent to the first spring 331a.

The first fixing part 331 further includes a first coupling end 331c to couple an end of the first spring 331a to an end of the second spring 331b, and the first coupling end 331c is formed in parallel to a bottom of the sub-cavity.

The second fixing part 322 is formed adjacent to the first fixing part 331 and provided in the sub-cavity.

The second fixing part 332 includes a third spring 332a bent from the protrusion of the fourth power electrode 117 to the sub-cavity and extending, and a fourth spring 332b extending from the second reference electrode 131 and provided adjacent to the third spring 332a.

The second fixing part 332 further includes a second coupling end 332c to couple an end of the third spring 332a to an end of the fourth spring 332b, and the second coupling end 332c is formed in parallel to a bottom of the sub-cavity.

The first and second coupling ends 331c and 332c are spaced apart from each other adjacent to each other, and include an coupling island 243 formed at a separation space under the first and second coupling ends 331c and 332c and including the insulating layer 200 and the support substrate 400 so that the first and second coupling ends 331c and 332c are electrically insulated from each other and mechanically fixed.

The fixed substrate 110 and the second drive electrode 130 are electrically and mechanically coupled to each other by the fourth elastic part 330.

The four elastic parts 300, 310, 320, and 330 include an equal number of springs, and are formed to face each other at both ends of the drive electrode parts 120 and 130 of the magnetic field sensor 100 to distribute tension.

The four elastic parts 300, 310, 320, and 330 are formed symmetrically to each other to maintain whole balancing, so that device reliability can be ensured.

The four elastic parts 300, 310, 320, and 330 include only the electrode layer 500 except for the coupling islands 301b, 302b, 311b, 312b, 321b, 322b, 331b, and 332b not only to electrically connect elements with each other each other, but also mechanically couple the elements to each other, thereby providing resilience due to elasticity after driving.

In addition, the elastic parts 300, 310, 320, and 330 are identically configured, and have the metallic layer 500 extending from electrodes of the fixed substrate 110 except for the coupling islands, so that the electric conductivity may be increased.

Hereinafter, a method of fabricating the magnetic field sensor of the FIG. 1 will be described with reference to FIGS. 7 to 13.

Figure 7:
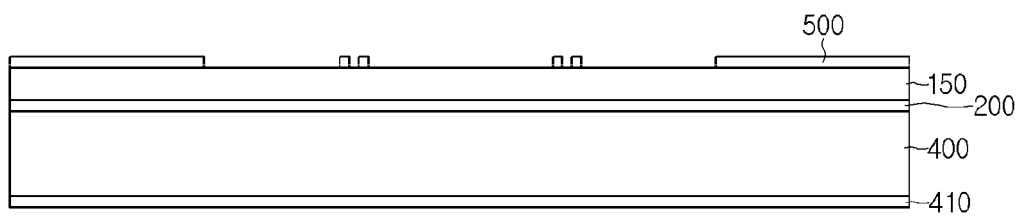
FIGS. 7 to 13 are sectional views showing a method of fabricating the magnetic field sensor of FIG. 1.

First, as shown in FIG. 7, a pattern is formed on a base substrate using the metallic layer 500.

The base substrate has a structure in which the insulating layer 200 and the electrode layer 150 are formed on the substrate 400.

The support substrate 400 has the thickness in the range of 300 µm to 500 µm, and preferably has the thickness of 400 µm.

When the support substrate 400 is a silicon substrate, the insulating layer 200 may be formed of a silicon oxide layer or a silicon nitride layer and may have the thickness of about 1.5 µm.

The electrode layer 150 may include a conductive material, such as silicon (Si), copper (Cu), aluminum (Al), molybdenum (Mo), or tungsten (W). Preferably, when the support substrate 400 is the silicon substrate, the electrode layer 150 may be formed of Si. The electrode layer 150 may have the thickness of 10 µm to 100 µm, and preferably have the thickness of about 50 µm.

In other words, the support substrate 400 may be a silicon substrate including a silicon insulating layer 200, and an external insulating layer 410 may be formed under the support substrate 400.

The external insulating layer 410 may be a silicon oxide layer or a silicon nitride layer having the thickness of about 1.5 µm.

The metallic layer 500 is formed on the electrode layer 150, and patterned to form a plurality of patterns 521, 526, 531, and 536.

The patterns 521, 526, 531, and 536, which are metallic patterns 521, 526, 531, and 536 formed from the electrode layer 150 of FIG. 1 to improve electric conductivity, may be formed at the power electrodes 111, 112, 116, and 117, the sensing electrodes 113, 114, 118, and 119, a plurality of elastic parts 300 to 330, and portions of the bodies of the drive electrode parts 120 and 130.

Figure 8:
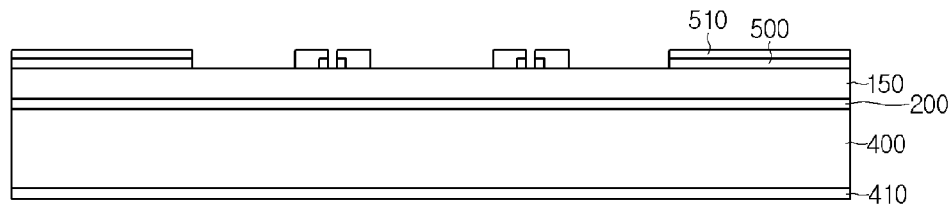
Figure 9:
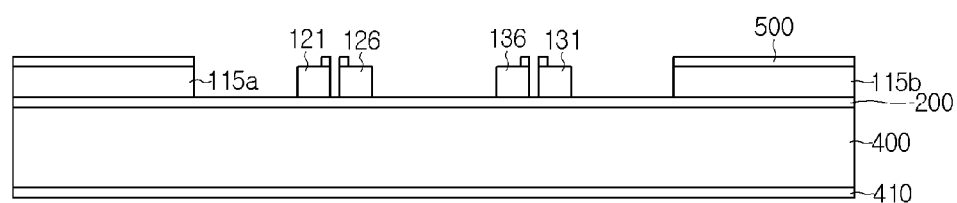

Next, as shown in FIGS. 8 and 9, a mask 510 is formed on the metallic patterns 521, 526, 531, and 536, and the electrode layer 150, and the upper electrode layer 150 is etched according to designs to form electrodes, electrode pieces, and springs.

In detail, after forming a photo-mask 510 on the metallic layers 521, 526, 531, and 536, and the electrode layer 150, the patterns may be formed by removing the electrode layer 150 exposed by the photo-mask 510.

In this case, reactive ion etching may be performed as an etching process.

Figure 10:
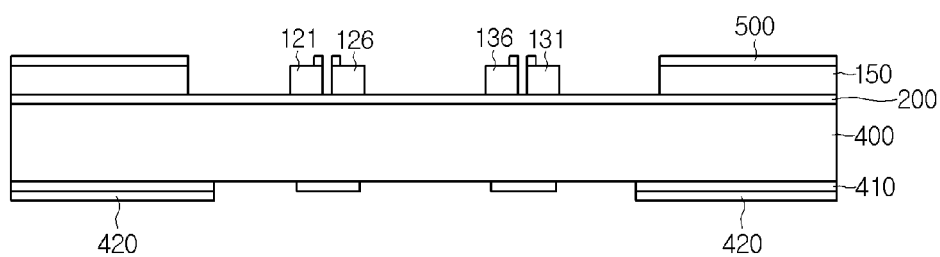
Figure 11:
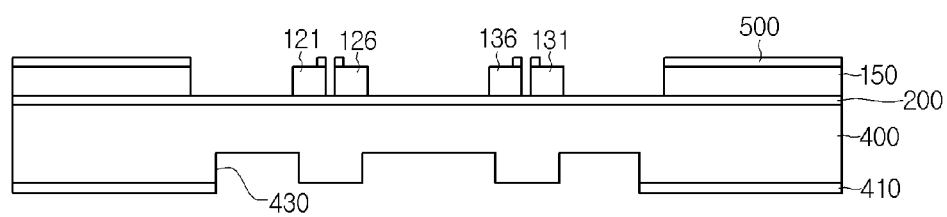

After removing the mask pattern 510, a photo-mask 420 is formed on the external insulating layer 410 under the substrate 400 as shown in FIG. 10 and the resultant structure is patterned to remove the support substrate 400.

In detail, after the photo-mask 420 has been formed on the external insulating layer 410 on the support substrate 400, the external insulating layer 410 is patterned so that the external insulating layer 410 remains only at the lower portion of the fixed substrate 110. Thereafter, the support substrate 400 exposed as the photo-mask 420 is formed only at the lower portions of the fixed substrate 110 and the lower portions of the coupling parts 20 and 230 and the coupling islands 240 to 243 is removed to form the coupling parts 220 and 230 and the coupling islands 240 to 243 of FIG. 12.

Figure 12:
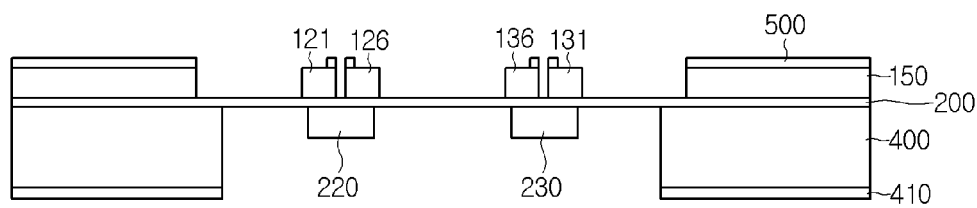

In this case, as shown in FIG. 12, the support substrate 400 is selectively etched so that the support substrate under the coupling parts 220 and 230 and the coupling islands 240 to 243 have the thickness thinner than those of the support substrate 400 of the fixed substrate 110. The selective etching process may be performed by performing an etching process two times or using a mask (gradation or pattern mask) allowing exposing step by step.

In this case, a protective layer (not shown) may be formed at an upper structure to protect upper patterns before processes for the lower structure are performed.

Figure 13:
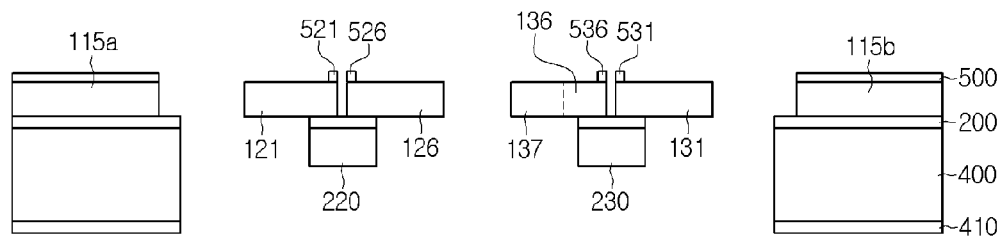

Thereafter, as shown in FIG. 13, the internal silicon insulating layer 200 is etched according to designs to float the drive electrode parts 120 and 130.

In this case, the etching of the internal silicon insulating layer 200 may be performed through plasma etching and employ use oxidation fluorine gas.

Accordingly, the insulating layer 200 selectively remains only under a portion of the electrode layer pattern 150. For example, the insulating layer 200 may remain under the coupling islands 240 to 243 of the first to fourth elastic parts 300 and 310 and the coupling parts 220 and 230 of the drive electrode parts 120 and 130 to insulating two structures from each other while physically fixing the two structures.

The magnetic field sensor formed through the above process, which is a MEMS device, is maintained in a floating state and fixed by the springs to move for magnetic field sensing.

Hereinafter, the driving of the first embodiment will be described with reference to FIGS. 14 to 18.

Figure 14:
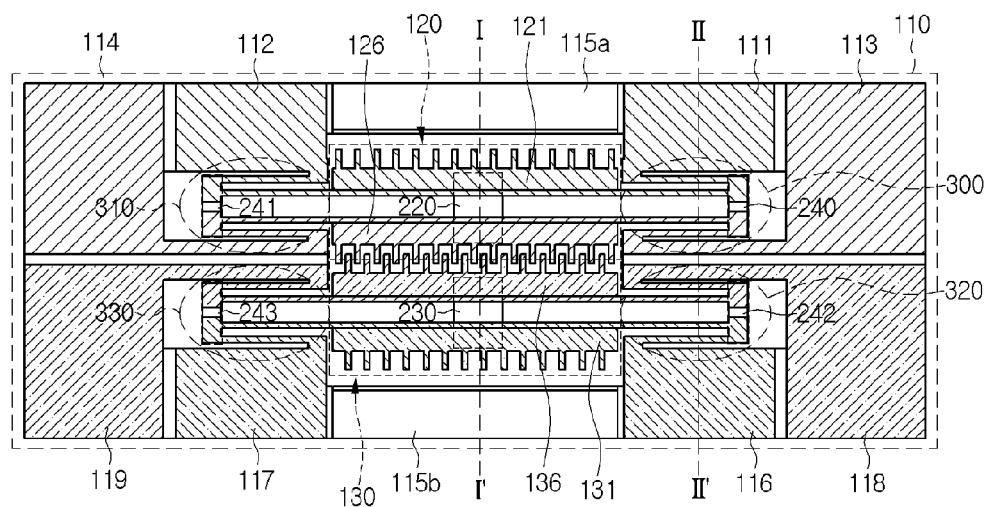
FIG. 14 is a view showing the state of the voltage of the magnetic field sensor shown in FIG. 1.
Figure 15:
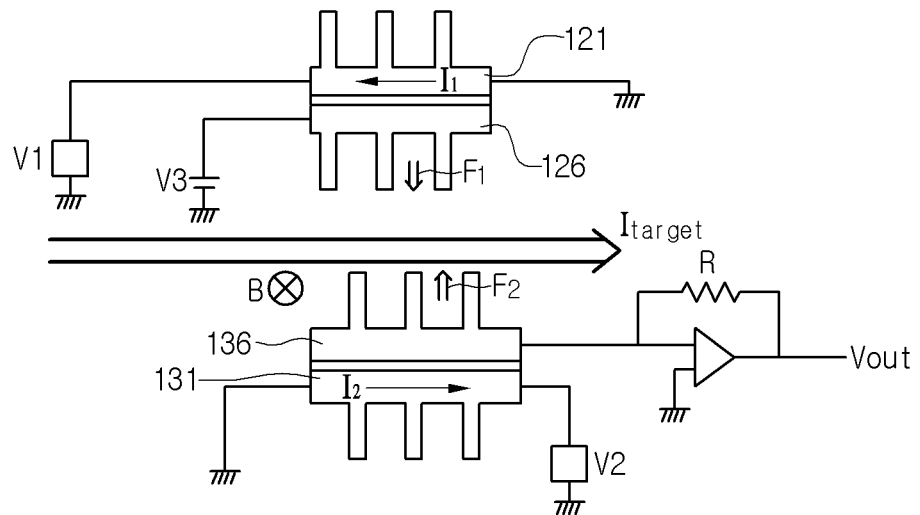
FIG. 15 is a circuit diagram showing the voltage and the sensing of the magnetic field sensor of FIG. 1.
Figure 16:
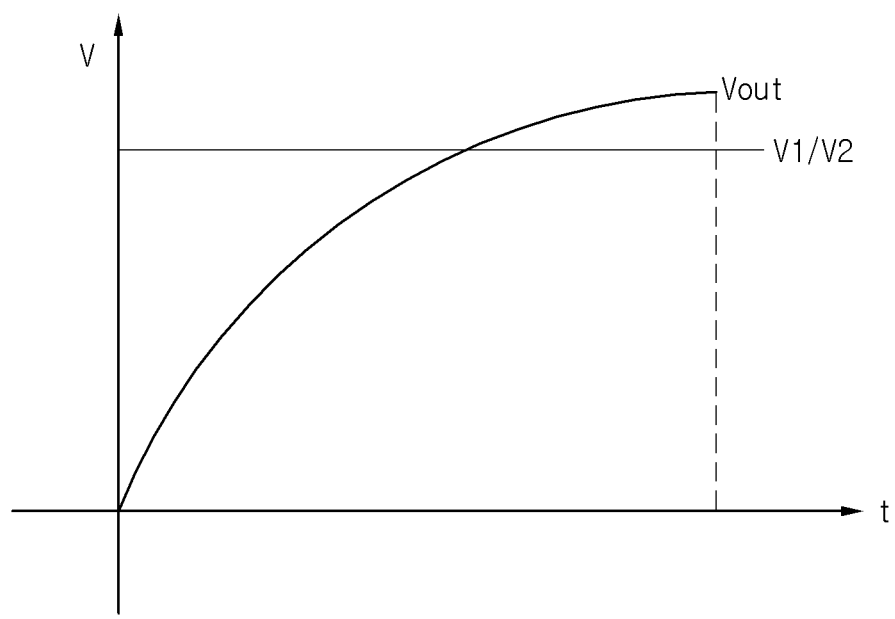
FIG. 16 is a graph showing a waveform of the output when DC voltage is applied to the magnetic field sensor of FIG. 15.
Figure 17:
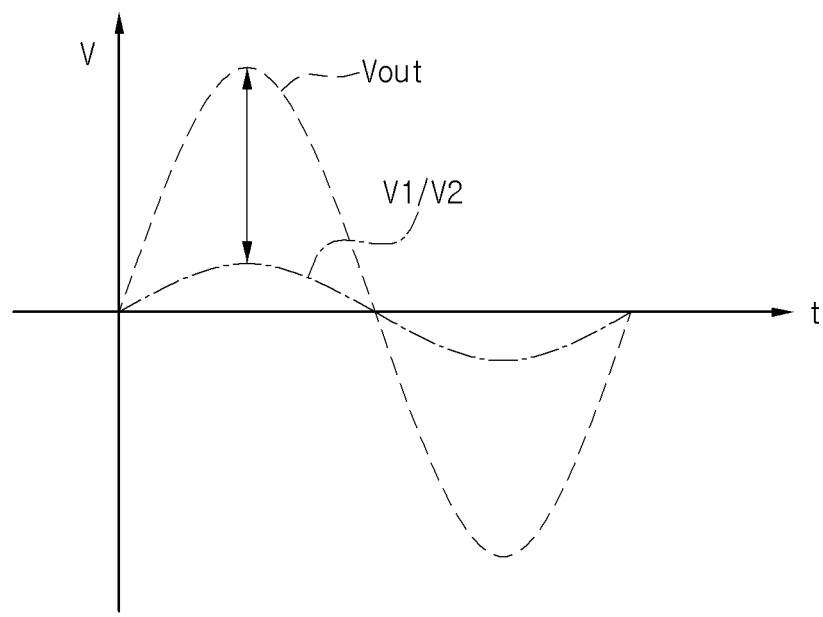
FIG. 17 is a graph showing the voltage when AC voltage is applied to the magnetic field sensor of FIG. 15.
Figure 18:
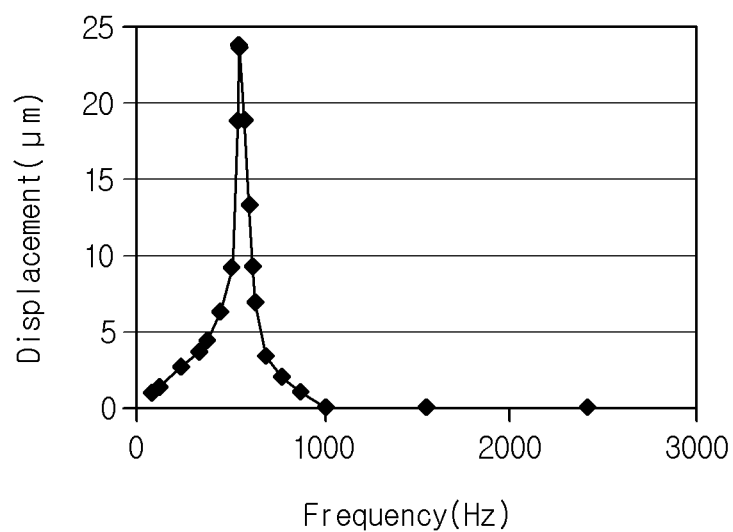
FIG. 18 is a graph showing the displacement of the magnetic field sensor as a function of a frequency.

FIG. 14 is a view showing the state of the voltage of the magnetic field sensor shown in FIG. 1. FIG. 15 is a circuit diagram showing the voltage and the sensing of the magnetic field sensor of FIG. 1. FIG. 16 is a graph showing a waveform of the output when DC voltage is applied to the magnetic field sensor of FIG. 15. FIG. 17 is a graph showing the voltage when AC voltage is applied to the magnetic field sensor of FIG. 15, and FIG. 18 is a graph showing the displacement of the magnetic field sensor as a function of a frequency.

Referring to FIG. 14, three voltages are supplied in total to detect the variation of the capacitance for the magnetic field sensing.

A first voltage V1 is applied to one of the first power electrode 111 and the second power electrode 112 electrically connected with the first power electrode 111, and a second voltage V2 is applied to one of a third power electrode 116 and a fourth power electrode 117 electrically connected with the third power electrode 116.

The first and second voltages V1 and V2 serve as sources to which a reference voltage is applied. When the first and second voltages V1 and V2 are applied to the first reference electrode 121 and the second reference electrode 131, respectively, a first current I1 and a second current I2 flow.

When a target current Itarget flows around a conductor in a stationary state, a magnetic field B is generated around the conductor. In this case, first and second currents I1 and I2 are applied to the first reference electrode 121 and the second reference electrode 131, forces F1 and F2 are produced perpendicularly to the magnetic field B generated by the target current. In this case, if currents flow in opposite directions, forces are exerted on the first and second reference electrodes 121 and 131 in opposite directions. If currents flow in the same direction, the first and second reference electrodes 121 and 131 move in the same direction (according to Flemming left hand rule). In this case, a third voltage V3 is applied to the first sensing electrode 113 connected with the first variable electrode 126, or the second sensing electrode 114 connected with the first sensing electrode 113, and a sensing signal is output from the third sensing electrode 118 connected with the second variable electrode 136, or the fourth sensing electrode 119 connected with the third sensing electrode 118.

In this case, the sensing signal is generated as the first variable electrode 126 and the second variable electrode 136 move by Lorentz force produced by the magnetic field B generated by the target current Itarget In other words, as the first and second variable electrodes 126 and 136 move up and down, the variable electrode pieces 127 and 137 are overlapped with each other. In this case, the size of the overlapped size is determined depending on the size of the magnetic field B, and capacitance is determined depending on the size of the overlapped size.

The output sensing signal is the variation of the capacitance. The output sensing signal may be read out of the output of an amplifier connected with the third or fourth sensing electrode 118 or 119 connected with the second variable electrode 136 as shown in FIG. 15.

In this case, the output value Vout of the amplifier is expressed as the following equation.

$$Vout = R*V3*dc/dt \qquad \text{Equation 1}$$

In this case, as shown in FIG. 16, when the first and second voltages V1 and V2 are DC voltages, the magnetic field B and Lorenz force may be generated in a pulse waveform. Accordingly, the capacitance of the variable capacitor formed by the first and second variable electrodes 126 and 136 is increased to a value in a predetermined range and the variation of the capacitance is stopped.

Accordingly, the output value Vout may have the form of a quadratic function.

Meanwhile, when the first and second voltages V1 and V2 are AC voltages, the directions of the currents I1 and I2 are varied depending on the direction of the AC voltage, so that the direction of the magnetic field B is varied.

Therefore, since the forces F1 and F2 exerted on the first and second variable electrodes 126, the overlapped area between the first variable electrode 126 and the second variable electrode 136 are periodically varied.

In this case, when the frequencies of the first and second voltages V1 and V2, which are AC voltages, are matched with the mechanical resonance frequency, the mechanical displacement is increased with respect to the same force, so that the sensing capability can be improved.

In this case, the mechanical resonance frequency of the magnetic field sensor satisfies the following equation.

$$Fr = 1/2\pi*(k/m)^{1/2} \qquad \text{Equation 2}$$

In Equation 2, fr is defined as the mechanical resonance frequency, m denotes mass of the magnetic field sensor and satisfies Equation 3, k denotes a spring stiffness constant and satisfies Equation 4.

$$m = \rho_{si} * V_{total} \qquad \text{Equation 3}$$

In Equation 3, ρsi denotes the surface resistance value of silicon, and Vtotal is defined as the total volume of the magnetic field sensor.

$$k = 2NEtw^3/L \qquad \text{Equation 4}$$

In this case, N E, t, w, and L are defined as the number of springs, Young's modulus, the thickness of a spring, the width of the spring, and the length of the spring, respectively.

FIG. 18 is a graph showing a measurement result of the displacement of the magnetic field sensor by varying the frequency of an input voltage on the assumption that the mechanical resonance frequency is 500 Hz according to one embodiment of the disclosure.

It may be observed from FIG. 18 that the displacement of the magnetic field sensor is maximized when the frequency of the input AC voltage is matched with the mechanical resonance frequency, As described above, when the mechanical resonance frequency of the magnetic field sensor is calculated to be found, and the found mechanical resonance frequency is input into the frequency of the AC input voltage, since the variation of the capacitance of the variable capacitor is increased due to the significantly high displacement of the magnetic field sensor as shown in FIG. 18, a large output value Vout can be found as shown in FIG. 17.

According to one embodiment, the magnetic field sensor through which an AC current flows is designed to be maintained in a normal state by the mass of the magnetic field sensor, and triggered by the Lorenz force produced due to an external magnetic field, so that the drive electrode part makes a resonance and thus outputs an output value Vout as shown in FIG. 17.

Accordingly, two drive electrodes are displaced in both directions to increase the displacement to two times, and the displacement is maximized by matching the frequency of the AC input voltage with the mechanical resonance frequency of the magnetic field sensor so that the sensing capability of the sensing capability can be more improved.

Hereinafter, various embodiments will be described with reference to FIGS. 19 to 24.

Figure 19:
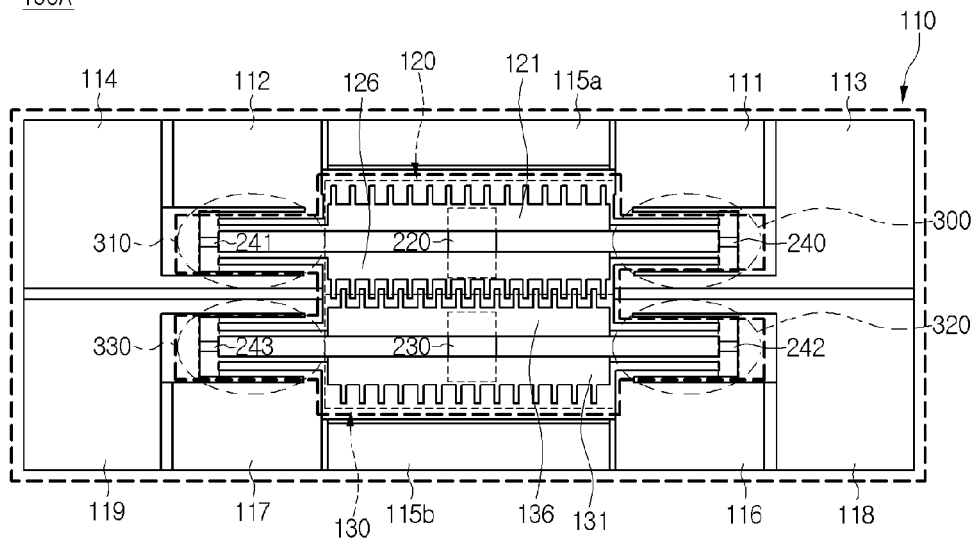
FIG. 19 is a top view showing a magnetic field sensor according to the second embodiment of the disclosure.

A magnetic field sensor 100A according to the second embodiment as shown in FIG. 19 includes a fixed substrate 110, drive electrode parts 120 and 130, and a plurality of elastic parts 300, 310, 320, and 330 similarly to the magnetic field sensor of FIG. 1.

The fixed substrate 110 supports the drive electrode parts 120 and 130 and the elastic parts 300, 310, 320, and 330.

The drive electrode parts 120 and 130 are provided in a cavity 215 of the fixed substrate 110, and include the first drive electrode 120 surrounded by first and second sensing electrodes 113 and 114 and the first and second power electrodes 111 and 112 to receive power, and a second drive electrode 130 surrounded by the third and four sensing electrodes 118 and 119 and the third and fourth power electrode 116 and 117 to receive power.

The first drive electrode 120 includes a first reference electrode 121 and a first variable electrode 126 extending in a y axial direction and at least one coupling part 220 to couple the first reference electrode 121 to the first variable electrode 126 in the cavity 215.

Meanwhile, the second drive electrode 130 includes a second reference electrode 131 and a second variable electrode 136 extending in the y axial direction and at least one second coupling part 230 to couple the second reference electrode 131 and the second variable electrode 136 to each other in the cavity 215.

The second reference electrode 131 and the second variable electrode 136 are formed as electrode layers extending from the elastic parts 300, 310, 320, and 330.

Electrode pieces are formed at a longer side of each of the electrodes 121, 126, 131, and 136, the electrode pieces of the first variable electrode 126 are alternately aligned with the electrode pieces of the second variable electrode 136, and the electrode pieces of the first variable electrode 126 and the second variable electrode 136 move according to power applied thereto from the fixed substrate 110 to vary capacitance.

The electrodes of the fixed substrate 110 and the electrodes of the first and second drive electrodes 120 and 130 are electrically and mechanically connected with each other by the elastic parts 300, 310, 320, and 330.

Since the fixed substrate 110, the drive electrode parts 120 and 130 and the elastic parts 300, 310, 320, and 330 have the same basic configurations as those of elements of the magnetic field sensor of FIG. 1, the detail thereof will be omitted.

In this case, the magnetic field sensor 110A according to the second embodiment does not include a metallic layer on the electrode layer 150, different from that of the first embodiment.

In other words, the magnetic field sensor 100A according to the second embodiment includes only the electrode layer 150 to maintain electrical conduction. Accordingly, the fabrication process of the magnetic field sensor is simplified and the cost is reduced.

However, when the electrode layer 150 is formed of Si according to the disclosure, a lower resistance area may be formed in the electrode layer 150 by doing Si with boron (B), phosphorus (P), or arsenic (As) to ensure the electrical conductivity.

Figure 20:
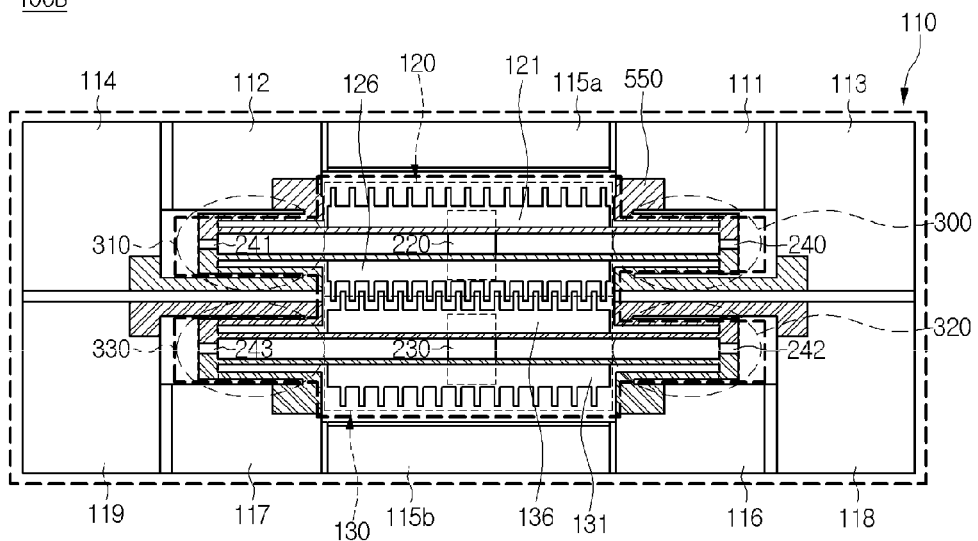
FIG. 20 is a top view showing a magnetic field sensor according to the third embodiment of the disclosure.

A magnetic field sensor 100B according to the third embodiment as shown in FIG. 20 includes a fixed substrate 110, drive electrode parts 120 and 130, and a plurality of elastic parts 300, 310, 320, and 330 similarly to the magnetic field sensor of FIG. 1.

The fixed substrate 110 supports the drive electrode parts 120 and 130 and the elastic parts 300, 310, 320, and 330.

The drive electrode parts 120 and 130 are provided in a cavity 215 of the fixed substrate 110, and include the first drive electrode 120 surrounded by first and second sensing electrodes 113 and 114 and the first and second power electrodes 111 and 112 to receive power, and a second drive electrode 130 surrounded by the third and four sensing electrodes 118 and 119 and the third and fourth power electrode 116 and 117 to receive power.

The first drive electrode 120 includes a first reference electrode 121 and a first variable electrode 126 extending in a y axial direction and at least one coupling part 220 to couple the first reference electrode 121 to the first variable electrode 126 in the cavity 215.

Meanwhile, the second drive electrode 130 includes a second reference electrode 131 and a second variable electrode 136 extending in the y axial direction and at least one second coupling part 230 to couple the second reference electrode 131 to the second variable electrode 136 in the cavity 215.

The second reference electrode 131 and the second variable electrode 136 are formed the form of electrode layers extending from the elastic parts 300 and 310.

Electrode pieces are formed at a longer side of each of the electrodes 121, 126, 131, and 136, the electrode pieces of the first variable electrode 126 are alternately aligned with the electrode pieces of the second variable electrode 136, and the electrode pieces of the first variable electrode 126 and the second variable electrode 136 move according to power applied thereto from the fixed substrate 110 to vary capacitance.

The electrodes of the fixed substrate 110 and the electrodes of the first and second drive electrodes 120 and 130 are electrically and mechanically connected with each other by the elastic parts 300, 310, 320, and 330.

Since the fixed substrate 110, the drive electrode parts 120 and 130 and the elastic parts 300, 310, 320, and 330 have the same basic configurations as those of elements of the magnetic field sensor of FIG. 1, the detail thereof will be omitted.

In this case, different from that of the first embodiment, in the magnetic field sensor 110B according to the third embodiment of the disclosure, a metallic layer is formed at portions of the electrodes 111 to 119 of the fixed substrate 110.

In other words, the metallic layer is formed along the longer side of the body of the elastic parts 300, 310, 320, and 330, and the drive electrode parts 120 and 130, and formed only at portions of the electrodes of the fixed substrate 110.

In this case, the metallic layer formed at the electrodes 111 to 119 of the fixed substrate 110 is connected to the outside to serve as a pad 550 to receive input voltage.

As shown in FIG. 20, the pad 550 may be formed most closely to end portions of the elastic parts 300, 310, 320, and 330, and may be formed in a rectangular shape and a circular shape.

As shown in FIG. 20, when the pad 550 is formed in the rectangular shape, the area of the pad 550 may satisfy the range of 50 μm×50 μm to 500 μm×500 μm, and preferably be about 200 μm×200 μm.

As shown above, as the metallic layer is formed at portions of the drive electrode parts 120 and 130 and the elastic parts 300, 310, 320, and 330, the pads connected with the metallic layer is formed only on portions of the electrodes 111 to 119 of the fixed substrate 110, so that the electrical conductivity may be ensured and the fabrication cost may be reduced.

Meanwhile, in the magnetic field sensor according to the disclosure, two drive electrodes 120 and 130 move without a fixed electrode to significantly increase the displacement of the magnetic field sensor. In particular, as shown in FIG. 17, when the frequency equal to mechanical resonance frequency is applied to the AC input voltage, the displacement may be more increased.

In this case, as the displacement is significantly increased, a sidewall of one of the variable electrode pieces 127 and 137 collides with a sidewall of the variable electrode pieces 127 and 137 facing the one electrode piece, thereby causing the damage to the device.

Figure 21:
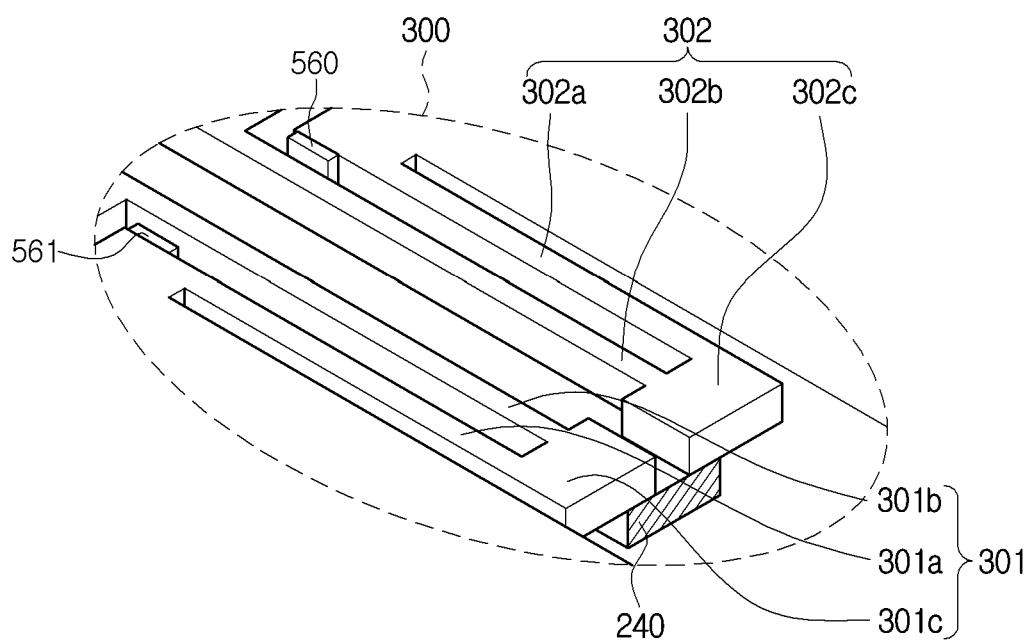
FIG. 21 is a top view showing a magnetic field sensor according to the forth embodiment of the disclosure.

In order to prevent the device from being damaged, a magnetic field sensor according to the fourth embodiment as shown in FIG. 21 may include stoppers 560 and 561 interposed at a space between the elastic parts 300, 310, 320, 330 and protrusions of the fixed substrate 110 coupled thereto.

The stoppers 560 and 561 are formed at contact areas between the end portions of the springs 301a and 302a and the protrusions to restrict the displacements of the springs 301a and 302a.

The stoppers 560 and 561 may be formed of a material, such as resin including epoxy resin, having elasticity.

In this case, the stoppers 560 and 561 may be applied to one of the magnetic field sensors 100 to 1008 according to the first to third embodiments.

Figure 22:
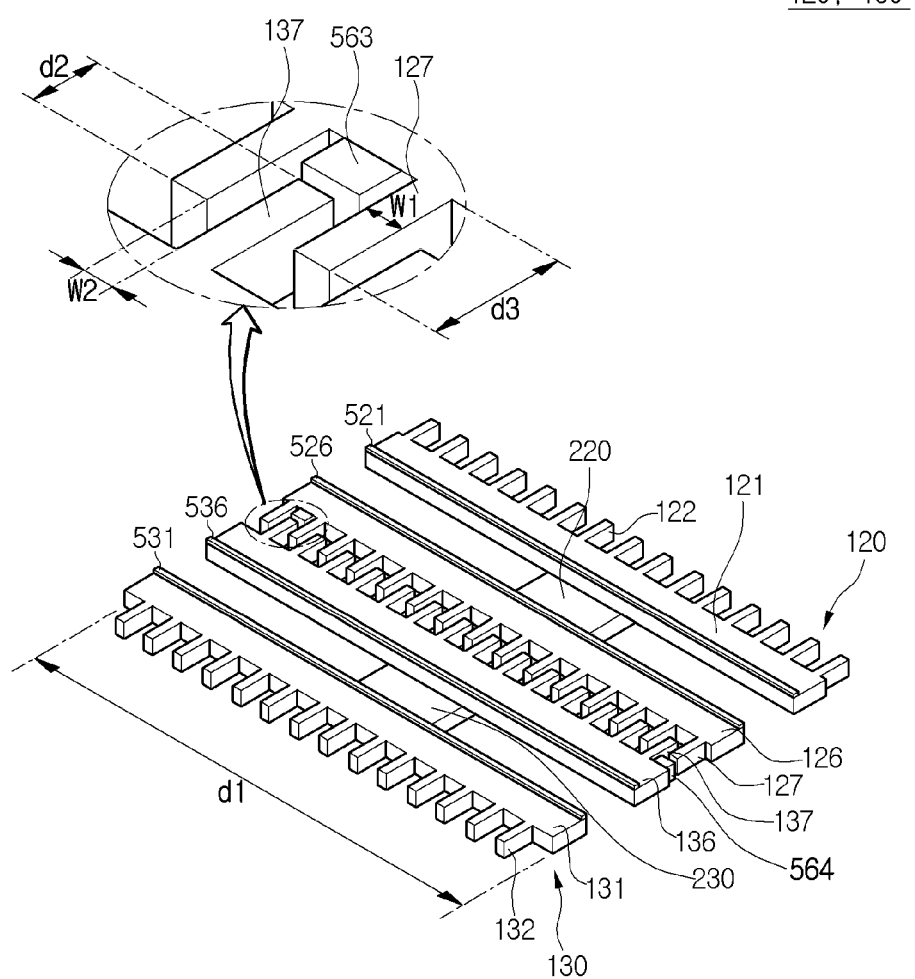
FIG. 22 is a top view showing a magnetic field sensor according to the fifth embodiment of the disclosure.

Meanwhile, a magnetic field sensor according to a fifth embodiment may include stoppers 563 and 564 provided in the drive electrode parts 120 and 130 as shown in FIG. 22.

When the stoppers 563 and 564 are included in the drive electrode parts 120 and 130, the stoppers 563 and 564 may be provided on inner walls of the electrode pieces 127 and 137 of the first and second variable electrodes 126 and 136 facing each other, or may be attached to inner walls of the electrode pieces provided at the edges of the first and second variable electrodes 126 and 127.

In other words, when the stoppers 563 and 564 are formed in the drive electrode parts 120 and 130, the first stopper 563 may be formed on the inner wall at the edge of the first variable electrode 126, and the second stopper 564 may be formed on the inner wall at the edge of the variable electrode 136 opposite to the inner wall at the edge of the first variable electrode 126.

The first stopper 563 is the same as the second stopper 564 in material, size, and shape. Accordingly, the displacements of the two variable electrodes 126 and 136 fluctuating in both directions may be constantly fixed.

In this case, the stoppers 563 and 564 may be applied to one of the magnetic field sensors 100 to 1008 according to the first to third embodiments.

Meanwhile, the magnetic field sensor according to the disclosure may include a cantilever-type of variable electrode pieces.

Hereinafter, the magnetic field sensor having the cantilever-type of variable electrode pieces will be described.

Figure 23:
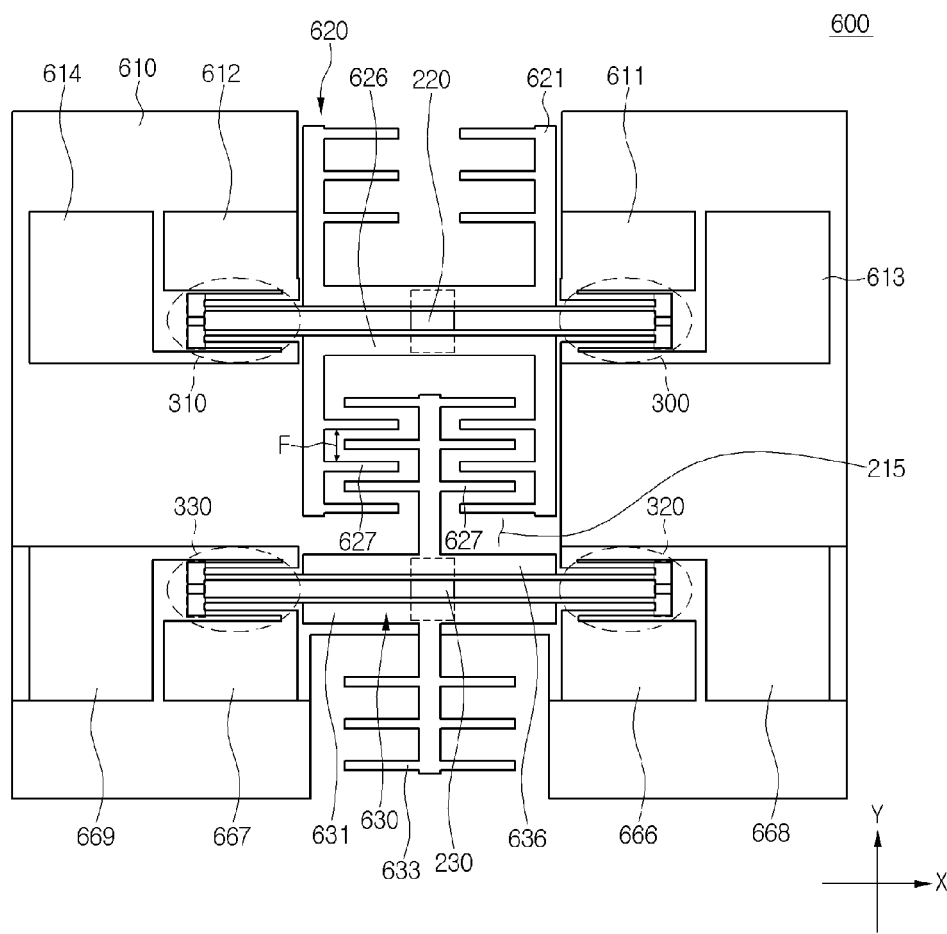
FIG. 23 is a top view showing a magnetic field sensor according to the sixth embodiment of the disclosure.

Referring to FIG. 23, a magnetic field sensor 600 includes a fixed substrate 610, drive electrode parts 620 and 630, and a plurality of elastic parts 300 to 330.

The fixed substrate 610 supports the drive electrode parts 620 and 630 and the elastic parts 300, 310, 320, and 330.

The drive electrode parts 620 and 630 are provided in the cavity 215 of the fixed substrate 610, and include the first drive electrode 620 and the second drive electrode 630.

The first drive electrode 620 includes a first reference electrode 621 and a first variable electrode 626 extending in an x axial direction and at least one first coupling part 220 to couple the first reference electrode 621 and the first variable electrode 626 to each other.

Meanwhile, the second drive electrode 630 includes a second reference electrode 631 and a second variable electrode 636 extending in the x axial direction and at least one second coupling part 230 in the cavity 215.

The second reference electrode 631 and the second variable electrode 636 are formed as electrode layers extending from the elastic parts 300, 310, 320, and 330.

The first reference electrode 621 may have the same shape as that of the first variable electrode 627.

Each of the electrodes 621 and 627 includes a body having a longer side extending in an x axial direction, two branch parts protruding from the body in parallel to a y axial direction, and a plurality of electrode pieces 623 and 627 protruding from two branch parts while facing each other.

The first reference electrode 621 and the first variable electrode 626 of the first drive electrode 620 have the same shape, and are formed symmetrically to each other about the bodies thereof.

In the second drive electrode 630, although each of the reference electrode 631 and the variable electrode 636 has the same shape as that of the first drive electrode 620, each of the reference electrode 631 and the variable electrode 636 has one branch part protruding from the center of the body and a plurality of electrode pieces 633 or 637 protruding from both lateral sides of the branch part in opposite directions.

The reference electrode 631 and the variable electrode 636 of the second drive electrode 630 have the same shape, and are formed symmetrically to each other about the bodies thereof.

In this case, the electrode pieces 627 and 637 of the first and second variable electrodes 626 and 636 are alternately aligned with each other to form a variable capacitor.

In the case of the magnetic field sensor 600 of FIG. 23, if power is applied to a plurality of electrodes 611 to 619 of the fixed substrate 610, current is applied to the first and second reference electrodes 621 and 631 to form a magnetic field.

As the magnetic field is formed, the first and second variable electrodes 626 and 636 move in the y axial direction, so that the distance between the electrode pieces 627 and 637 of the first and second variable electrodes 626 and 636 is varied.

That is to say, in the magnetic field sensor 600 of FIG. 23, the overlapped area of the capacitor formed as the two electrode pieces 627 and 637 are overlapped with each other is constant, but a dielectric layer of the capacitor is varied depending on the magnetic field to vary the capacitance, so that the magnetic field may be sensed.

In the case of the magnetic field sensor 600 of FIG. 23, since the fixed substrate 610, the drive electrode parts 620 and 630, and the elastic parts 300 to 330 have the same sectional structures as those of FIG. 1, the details thereof will be omitted.

Figure 24:
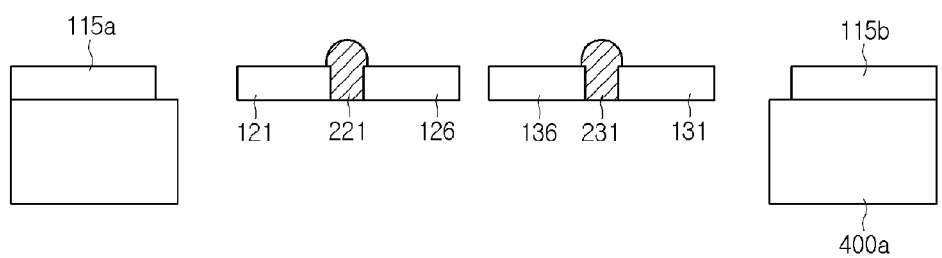
FIG. 24 is a top view showing a magnetic field sensor according to the seventh embodiment of the disclosure.

Meanwhile, a magnetic field sensor according to a seventh embodiment of the disclosure has the same top view as FIG. 1, and the sectional view taken along line I-I' of FIG. 1 may be the same as of FIG. 24.

Referring to FIG. 24, the fixed substrate 110 includes a support substrate 400$a$ having an insulating property, and an electrode layer 115$b$ is formed on the support substrate 400$a$ having the insulating property.

The support substrate 400$a$ having the insulating property may include an insulating material such as glass or ceramic, and the electrode layer 115$b$ may include a conductive material, preferably, a high conductivity material such as Cu, Al, Mo, or W.

In this case, coupling parts 221 and 231 of the first and second drive electrodes 120 and 130 may be formed by filling adhesives in spaces between the reference electrode 121 and the variable electrode 126 and between the reference electrode 121 and the variable electrode 126.

In this case, the insulating adhesive may include insulating adhesive resin, such as polyimide or epoxy resin, and an insulating material, such as $SiO_2$ or $Si_3N_4$.

The support substrate 400$a$ is formed of the insulating material as described above, so that the magnetic field sensor of FIG. 1 can be realized in a two-layer structure without an insulating layer.

Although the exemplary embodiments of the disclosure have been described, it is understood that the disclosure should not be limited to these exemplary embodiments but various changes and modifications can be made by one ordinary skilled in the art within the spirit and scope of the disclosure as hereinafter claimed.

The invention claimed is:

1. A magnetic field sensor for sensing a magnetic field caused by a current to be measured, the magnetic field sensor comprising:
a substrate;
a first drive electrode having a path, which flows a reference current supplied from the substrate, to be movable by the magnetic field of the current to be measured; and
a second drive electrode having a path, which flows the reference current supplied from the substrate, to be movable by the magnetic field of the current to be measured,
wherein variation of a capacitance is measured by movement of the first drive electrode and the second drive electrode.

2. The magnetic field sensor of claim 1, wherein the first drive electrode comprises
a first reference electrode to flow the reference current supplied from the substrate and a first variable electrode electrically insulated from the first reference electrode and mechanically coupled to the first reference electrode to receive a sensing reference voltage applied thereto to measure the variation of the capacitance, and wherein the second drive electrode comprises a second reference electrode to flow the reference current supplied from the substrate and a second variable electrode electrically insulated from the first reference electrode and mechanically coupled to the second reference electrode to output variation of the sensing reference voltage resulting from the variation of the capacitance.

3. The magnetic field sensor of claim 2, further comprising an elastic part to mechanically and electrically connect the substrate with the first and second drive electrodes, wherein the first and second variable electrodes move by the magnetic field of the current to be measured to form a variable capacitor.

4. The magnetic field sensor of claim 2, wherein the first drive electrode comprises a first coupling part to mechanically couple the first reference electrode and the first variable electrode, which are insulated from each other, to each other, and wherein the second drive electrode comprises a second coupling part to mechanically couple the second reference electrode and the second variable electrode, which are insulated from each other, to each other.

5. The magnetic field sensor of claim 4, wherein the first variable electrode comprises a plurality of first electrode pieces protruding toward the second variable electrode, the second variable electrode comprises a plurality of second electrode pieces protruding toward the first variable electrode, and the first electrode pieces are alternately aligned with the second electrode pieces.

6. The magnetic field sensor of claim 5, wherein, in an MEMS magnetic field sensor, an overlapped area between the first electrode piece and the second electrode piece is variable depending on a first voltage and a second voltage.

7. The magnetic field sensor of claim 5, wherein, in an MEMS magnetic field sensor, a distance between the first electrode piece and the second electrode piece is variable depending on a first voltage and a second voltage.

8. The magnetic field sensor of claim 6, wherein the first reference electrode has a shape identical to a shape of the first variable electrode, and the second reference electrode has a shape identical to a shape of the second variable electrode.

9. The magnetic field sensor of claim 4, wherein the substrate comprises a support substrate, and an electrode layer for formation of a plurality of electrodes on the support substrate, and wherein the first and second reference electrodes, the first and second variable electrodes, and the elastic part are formed from the electrode layer to be maintained in a floating state from the substrate.

10. The magnetic field sensor of claim 9, wherein a thickness of the support substrate for the first and second coupling parts is thinner than a thickness of the support substrate for the substrate.

11. The magnetic field sensor of claim 4, wherein the first reference electrode and the second reference electrode receive a first voltage and a second voltage, respectively, within the magnetic field formed by the current to be measured.

12. The magnetic field sensor of claim 11, wherein the first and second voltages are DC voltages.

13. The magnetic field sensor of claim 11, wherein the first and second voltages are AC voltages.

14. The magnetic field sensor of claim 13, wherein, when the first and second voltages are the AC voltages, the AC voltages have frequencies identical to mechanical resonance frequencies of an MEMS magnetic field sensor.

15. The magnetic field sensor of claim 1, wherein the magnetic field sensor is a micro electro mechanical systems (MEMS) device.

* * * * *